United States Patent [19]
Letcher

[11] Patent Number: 4,786,829
[45] Date of Patent: Nov. 22, 1988

[54] LATCHED FEDBACK MEMORY FINITE-STATE-ENGINE

[76] Inventor: John H. Letcher, 7421 S. Marion, Tulsa, Okla. 74136

[21] Appl. No.: 17,751

[22] Filed: Feb. 24, 1987

[51] Int. Cl.⁴ .......................................... H03K 3/027
[52] U.S. Cl. ................................. 307/465; 307/480; 307/272.1; 377/64
[58] Field of Search .................. 307/465–469, 307/480, 272 R; 364/716; 365/78, 94, 103, 219; 377/64

[56] References Cited

U.S. PATENT DOCUMENTS

| | | | |
|---|---|---|---|
| 3,990,045 | 11/1976 | Beausoleil et al. | 307/465 X |
| 4,034,356 | 7/1977 | Howley et al. | 307/465 |
| 4,357,678 | 11/1982 | Davis | 307/465 X |
| 4,366,393 | 12/1982 | Kasuya | 307/465 X |
| 4,488,229 | 12/1984 | Harrison | 364/716 X |
| 4,562,427 | 12/1985 | Ecton | 307/465 X |
| 4,706,217 | 11/1987 | Shimizu et al. | 365/78 X |

OTHER PUBLICATIONS

Pilost et al, "Latched Inputs—An Improvement to PLA", *IBM T.D.B.*, vol. 20, No. 11A, Apr. 1978, pp. 4438–4439.
Mead and Conway, *Introduction to VLSI Systems*, Addison-Wesley Pub. Co., Reading, Mass., Oct. 1980, pp. 82–85.

*Primary Examiner*—Stanley D. Miller
*Assistant Examiner*—D. R. Hudspeth

[57] ABSTRACT

Disclosed herein is a simple latched-fedback-memory finite-state-engine that produces an inherently stable output upon the receipt of a clock signal, that is synchronously or asynchronously generated. The finite-state-engine comprises at least three latches and a function module, wherein the output of one latch is used as an input for the function module and a previous output of the function module is re-entered as an input into the function module.

9 Claims, 1 Drawing Sheet

LATCHED FEDBACK MEMORY FINITE-STATE-ENGINE

BACKGROUND OF THE INVENTION

1. Field of the Invention

The present invention relates to solid-state memory devices used as a finite-state-engine, such as a programmable logic array and, more particularly, to such a finite-state-engine with latched fedback memory features.

2. Setting of the Invention

In prior art programmable logic arrays (PLAs), such as the type shown in U.S. Pat. 4,124,899, during the transformation process used in the operation of the finite-state equations stores therein, there is a large period of time when the signals are considered unstable. This instability can cause jumbled, nonsensical data to be used as inputs; therefore, the desired output could be considered "garbage." To solve the problem of potential signal instability, complex circuitry and logic must be used to ensure that at a given instant the exact data set (input signal) is used as input for each of the several components within the PLA. This complex circuitry and logic operates successfully but has the drawbacks of being time consuming to ensure its correctness and if any change is desired to be made in the finite-state-equations, a total reconstruction of the synchronization circuitry and logic is required.

There is a need for a simple solid state device that can be used in place of prior art PLAs and have the capability of being easily altered and could not require the complex synchronization circuitry and logic.

SUMMARY OF THE INVENTION

The present invention has been contemplated to overcome the foregoing deficiencies and meet the above described needs. The latched fedback-memory finite-state-engine of the present invention does not require synchronization circuitry for its own internal operations because it utilizes latches to isolate or "freeze" a stable input and thus produce a stable output. Further, the operation of the finite-state-engine is totally, inherently synchronized by an outside supplied clock signal which can be altered upon demand.

The finite-state engine comprises three latches, such as parallel-entry shift registers, and a function module, such as a memory device, used to store the finite-state equations. The operation of the finite-state engine is controlled by the receipt of an outside supplied clock signal to the latches. A first latch has an input data set X and produces a stable output $X_1$, which is an isolated subsection of X, upon the receipt of the clock signal. The function module stores the finite state equations and has as an input $X_1$ and $Y_1$, and has an output $Y_1'$ and $Y_2'$. A second latch has as an input $Y_1'$ and produces an output $Y_1$ upon the receipt of the same clock signal. A third latch has as an input $Y_2'$ and produces an output $Y_2$ upon the receipt of a following clock signal.

DETAILED DESCRIPTION OF THE PREFERRED EMBODIMENTS

The present invention is a finite-state engine that can have wide utilization in microprocessor applications. Specifically, the present invention can be utilized as a substitute for conventional microprocessors or utilized in conjunction therewith. Further, the present invention can be used alone or in series or parallel with the same or like devices, such as PLAs, PALs and HALs.

All finite-state engines utilize finite-state equations. For example, a function module can be characterized by the production rule.

$Y(t+e) :: f(x(t))$, where "::=" is "obtained from," X represents a set of binary data values unrelated to other sets, Y is a set of stable binary values as an output obtained after a propagation delay time (e) as long as the input values X are stable throughout this time period. The function rule f is any combination of the usual AND, OR, XOR, and NOT logic functions.

Figure 1:
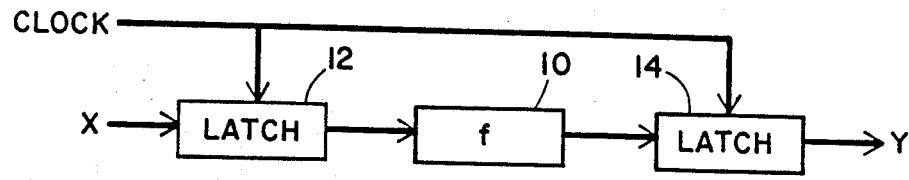
FIG. 1 is a block diagram of a latched Programmable Logic Array (PLA) embodying the present invention.

As part of the present invention the function module 10 as shown in FIG. 1, can be bracketed by latches 12 and 14. The latches 12 and 14 are devices that record and "freeze" the data values inputted on the rising edge of a clock signal. The "latched" values are maintained until the next rising edge of the clock signal.

The clock signal can be supplied synchronously, i.e. every 30 nano seconds, or asynchronously, i.e. a delay of 30 nano seconds followed by a delay of, for example, 10 seconds, by a clock signal generator, such as an interrupt request signal line.

The time interval e is defined such that $e = e_1 + e_2$ and X is stable within each interval:

$(t_0 + n*T = e_2)$ to $t_0 + n*T + e_1)$, $n = 0, 1 \ldots$ Each Y is therefore stable at least in the interval:

$(t_0 + n*T + e_1)$ to $(t_0 + (n+1)*T)$. Equivalently stated, X can be unstable in the interval $(t_0 + n*T + e_1)$ to $(t_0 + (N+1)*T - e_2)$ and Y (as an output signal is not stable, i.e. does not have reliable data values in each interval.

$(t_0 + n*T)$ to $(T_0 + n*T + e_1)$.

Figure 2:
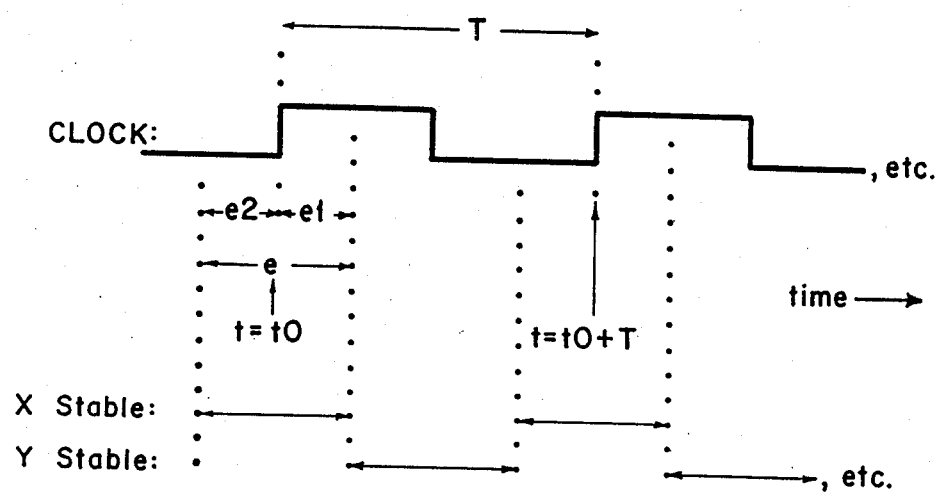
FIG. 2 is a block diagram of a timing sequence showing data input and output stability for one embodiment of the present invention.

The above described situation is diagrammatically shown in FIG. 2. Because of the instability periods, in conventional finite-state-engines, PLAs, PALs and the like require complex synchronization circuitry and logic to ensure that each step (input/output) taken by a component is stable. The inventor hereof has developed a finite-state-engine that eliminates the need for such synchronization circuitry, as shown in the following example.

Figure 3:
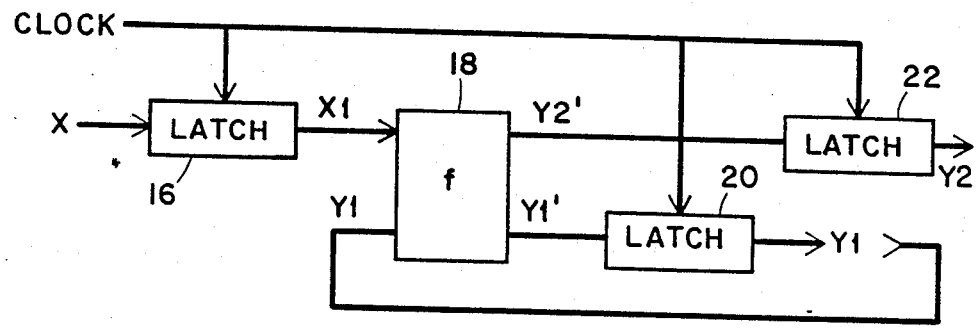
FIG. 3 is a block diagram of a latched fedback-memory finite state engine embodying the present invention.

A finite-state equation $Y(t+T) ::= f(X(t)), Y_1(t))$ where $Y = (Y_1, Y_2)$ can be easily implemented using simple, low cost components as shown in FIG. 3. A first latch 16 has a data set X delivered to it and upon the receipt of a clock signal will freeze a data subset $X_1$ and provide it as input to a function module 18. The function module 18 includes memory to store one or more finitestate equations such as the example above. The function module also has as an input $Y_1$, which will be described below, and as outputs $Y_1'$ and $Y_2'$. A second latch 20 is used as a feedback mechanism so that the output $Y_1$ is used as an input of the function module 18 upon the receipt of the same clock signal. A third latch 22 has as an input $Y_2'$ to produce the final, output $Y_2$ upon the receipt of a following clock signal.

The operation of the finite-state-engine works as follows. The data set X is one or more strings of binary values and, upon the receipt of the clock signal, whatever is at the input side of the latch 16 will be the output $X_1$ which is directed to the function module 18. The finite-state equations utilize the data $X_1$ and produces two outputs $Y_1'$ and $Y_2'$. The output $Y_1'$ is "frozen" by the latch 20 and fedback as an input $Y_1$ to the function module 18. The output $Y_2'$ of the function module is presented to and "frozen" by latch 22 to produce output $Y_2$. Therefore, $Y_2$ is generated not only from the output of the function module this clock signal but also from the output from the preceding clock signal.

Some of the benefits of utilizing a finite-state-engine of the present invention is that by defining $Y_1$=null, the same device can represent any combination logic when there is no feedback. Combinational logic within the finite-state engine is produced at the same speed as that of the situation calculus, thereby global synchronization of the logic can be greatly simplified over that used in prior art devices since prior art devices with changing inputs do not have long stable values. Because of these benefits, the finite-state-engine of the present invention can be used, alone or with other devices of like or dissimilar kind, as high speed arithmetic units, I/O computer controllers, intelligent bus controllers with error detection and correction, LISP engines for efficient handling of LISP pointer and atom space(s), communication controllers for area networks, and in place of microprocessors.

The latches 16, 20, and 22 can be shift registers, such as clock signal, edge triggered, parallel entry shift registers. A device of this type is entitled 74F374 manufactured by Signetics and Fairchild.

The function module 18 can be any programmable solidstate memory device, such as a PROM, EPROM, PLA, PAL or HAL. A device of this type is entitled MB7112Y and manufactured by Fujitsu Limited.

An important benefit of the present invention is its inherent speed. Since latches and a function module being a PROM have internal stability delays of between about 6.5 to about 20 nanoseconds respectively, then $e_1$ can be about 6.5 nanoseconds and $e_2$ 0 nanoseconds (see FIG. 2), therefore, the clock signal can be as short as about 26.5 nanoseconds. This is because the time delay between two falling edges of the clock signal has to be at least as long as the sum of the internal instability periods (or stability delays) of latch 16 and the function module 18. Furthermore, by utilizing emitter coupled logic (ECL) or galium-arsenide (GA) function module and latches, operational times of about 4 nanoseconds are possible.

Whereas the present invention has been described in particular relation to the Figures attached hereto, other and further modifications, apart from those shown or suggested herein may be made within the scope and spirit of the present invention.

What is claimed is:

1. A finite-state-engine comprising:
   a first latch means having as an input a data set X for producing an output $X_1$ upon the receipt of a clock signal;
   function module means for storing at least one finite-state equation and having as an input $X_1$ and $Y_1$, and as an output $Y_1'$ and $Y_2'$;
   a second latch means having as an input $Y_1'$ for producing an output $Y_1$ upon the receipt of the clock signal; and
   a third latch means having as an input $Y_2'$ for producing an output $Y_2$ upon the receipt of a following clock signal.

2. The finite-state-engine of claim 1 wherein one or more of the latch means comprises a shift register.

3. The finite-state-engine of claim 2 wherein one or more of the latch means comprises a parallel-entry shift register.

4. The finite-state-engine of claim 1 wherein the function module means comprises a programmable solid-state memory device.

5. The finite-state engine of claim 4 wherein the function module means is selected from the group consisting of RAM, PROM, EPROM, PLA, PAL and HAL.

6. The finite-state-engine of claim 1 wherein the at least one finite state equation is in the form of $Y := F(X, Y)$ where X is a state vector, := is replaced by, F is a Boolean function of X and Y of a preceding time state, and Y is an output vector.

7. The finite-state-engine of claim 1 wherein the clock signal is synchronously generated.

8. The finite-state-engine of claim 1 wherein the clock signal is asynchronously generated.

9. The finite-state-engine of claim 1 wherein a time lapse between two falling edges of the clock signal is greater than a total internal time delay of the first latch means and the function module means.

* * * * *